United States Patent [19]

Altmann et al.

[11] Patent Number: 5,825,825
[45] Date of Patent: Oct. 20, 1998

[54] METHOD OF PROCESSING MULTI-LEVEL SIGNALS FOR SIMPLE CLOCK RECOVERY

[75] Inventors: Michael Altmann, Sacramento, Calif.; Bernard Guay, Montreal, Canada

[73] Assignee: Northern Telecom Limited, Montreal, Canada

[21] Appl. No.: 715,218

[22] Filed: Sep. 17, 1996

[51] Int. Cl.$^6$ .................................................. H04L 25/49
[52] U.S. Cl. .............................................. 375/293; 327/50
[58] Field of Search .................................. 375/287, 289, 375/293, 294, 376; 327/98, 156, 162, 50, 52; 331/1 A, 11

[56] References Cited

U.S. PATENT DOCUMENTS

| | | | |
|---|---|---|---|
| 4,464,771 | 8/1984 | Sorensen | 375/120 |
| 4,618,941 | 10/1986 | Linder et al. | 375/289 |
| 4,651,026 | 3/1987 | Serfaty et al. | 307/269 |
| 5,115,450 | 5/1992 | Arcuri | 375/293 |
| 5,237,590 | 8/1993 | Kazawa et al. | 375/20 |

FOREIGN PATENT DOCUMENTS

2 031 694  4/1980  United Kingdom.

OTHER PUBLICATIONS

"Manchester Coding with Predistortion: An Efficient and Simple Transmission Technique in Local Digital Ring Networks", H. Meyr et al., IBM Zurich Research Laboratory, 8803 Ruschlikon, Switzerland, H. Bouten, Techn. University, RWTH Aachen, W. Germany 1980 IEEE, pp. 65.4.1–65.4.7.

*Primary Examiner*—Stephen Chin
*Assistant Examiner*—Joseph Roundtree
*Attorney, Agent, or Firm*—Foley & Lardner

[57] ABSTRACT

A method and a circuit for simple clock recovery from multi-level at high transmission rates. The circuit is compatible with standard PLL-type clock recovery techniques for NRZ and generalized two-level signalling. The timing information is extracted from a single threshold crossing, irrespective of the number of levels (M) of the signal. This was verified to provide sufficient spectral information for the proper operation of a clock recovery PLL. The threshold may be programmed for various line codes.

8 Claims, 5 Drawing Sheets

METHOD OF PROCESSING MULTI-LEVEL SIGNALS FOR SIMPLE CLOCK RECOVERY

BACKGROUND OF THE INVENTION

1. Field of the Invention

This invention is directed to a method and a device for simple clock recovery, and in particular is directed to a method and a device for clock extraction from multi-level signals.

2. Background Art

Digital signals are currently transmitted through wires, optical fiber, or radio links. They are transmitted at a certain rate or frequency. In long haul, high bit rate optical fiber telecommunications or twisted pair transmission, appropriate coding and modulation of the signal for transmission are essential.

In a binary transmission system only two symbols are used, for example ±A. The symbol rate is 1/T symbols/s, where T is the interval for transmitting a symbol. Transmission rates up to 2B symbols/s could be obtained within a bandwidth of B Hz. Therefore, transmission of a pure binary digital signal requires a substantial bandwidth.

To increase the bit rate and to reduce the intersymbol interference (ISI), it is known to use multi-level signalling, where a number of successive binary pulses are combined in a known way to create each symbol, so that the receiver can correctly recover the transmitted data stream. In multi-level transmission systems each symbol corresponds to one of M distinct levels, and one of M possible symbols is transmitted during each T-second interval. Particular bit to symbol mappings may be used to further compress the spectrum of the transmitted signal. M-ary signalling may be obtained through varying the amplitude level, frequency and phase of a sinewave. Multi-level signals in the present invention mean pulse amplitude modulated signals of more than two levels containing more than one bit of information.

It is known to provide a receiver with a regenerating circuit which samples the received signal at a regular frequency equal to the bit rate, making a decision of the most probable symbol being transmitted at each sample. To obtain an accurate recovery of the data, the sampling frequency must be synchronized with the rate of the transmitted signal.

In general, clock extraction from multi-level signals is far more difficult than from two-level signalling. The additional complexity lies in the detection and processing of the many types of transitions possible with such signalling. Generally, either the leading or the trailing edge of the recovered clock pulses, which time the sampling circuit, must begin at the centre of each multi-level digital symbol to ensure that a best estimate of the received symbol can be made.

Current PLL based, or resonant based methods for recovering the clock from multi-level signals include variations on the methods of squaring loop, differentiation PLL or zero crossing detection, or insertion of spectral tones. Discrete time systems may take advantage of powerful digital signal processing (DSP) techniques, such as minimum mean squared error (MMSE), to extract clock information.

The square law extraction method uses adjustable LC filters. A variant of this method for extracting the clock pulses with the partial response class 4 (PR4) code line, provides raising the received signal to the fourth power and applying the biquadrate to an LC tank circuit. However, LC tank circuits are complex and expensive, require initial adjustment and their responses drift with ageing and temperature.

Another method that is currently used for clock recovery from multi-level signals is the PLL based zero-crossing method, whereby zero crossing points are detected by a discriminator provided with a threshold voltage set at 0 Volts. These signals are input to a phase looked loop (PLL) to extract the timing clock pulses. A zero-crossing method applicable to two-level code signal data transmission is disclosed in IEEE, NTC 1980, 64.5, "Manchester Coding With Predistortion: An Efficient And Simple Transmission Technique In Local Digital Ring Networks", by Meyr et al.

U.S. Pat. No. 5,237,590 (Kazawa et al, issued on Aug. 17, 1993 and assigned to Hitachi, Ltd.) discloses a clock recovery circuit with a double frequency PLL which is synchronized to all zero crossings of a 3-level PR4 signal. The double frequency is necessary because the zero detection for the PLL occurs both on data zeros, in the middle of the baud, and at −1 to +1 transitions, at the baud boundary. At high data rates, the use of a PLL with a double frequency presents important disadvantages. Operation of the circuit disclosed in the aforementioned U.S. Pat. No. 5,237,590 can cause false looking of the PLL on frequencies of 3/2 or 5/2 of the baud rate. Special restrictions need to be applied to the PLL frequency range of operation to prevent this.

At higher data rates, these methods become impractical for many digital baseband systems, for both implementation and regulatory reasons. At data rates with Nyquist frequencies approaching the maximum operating frequency of an integrated circuit fabrication technology, the simplest possible signalling and timing recovery methods must be used.

SUMMARY OF THE INVENTION

It is an object of the present invention to provide a simple clock recovery circuit for high transmission rates which solves, totally or in part, the problems encountered with the prior art clock recovery circuits.

It is another object of the invention to provide a clock recovery circuit and technique for multi-level signalling, which are compatible with standard PLL-type clock recovery techniques for NRZ and generalized 2-level signalling.

Still another object of the invention is to provide a clock recovery circuit and method having a programmable feature that functions with many multi-level line codes.

Accordingly, the invention is directed to a circuit for clock recovery from an M-ary signal, where M is the number of levels taken by the M-ary signal, comprising a comparator for receiving the multi-level signal and a reference level and providing a two-level signal; a transition detector for receiving the two-level signal and providing a pseudo-clock signal; and a phase locked loop (PLL) circuit for generating a recovered clock signal synchronized with the pseudo-clock signal.

The invention further comprises a method for clock recovery from an M-ary signal, where M is the number of levels taken by the M-ary signal, comprising the steps of comparing the M-ary signal with a reference level to provide a two-level signal; generating a pseudo-clock signal comprising all transitions between the two levels in the two-level signal; and synchronizing a PLL circuit with the pseudo-clock signal for generating a recovered clock signal.

Advantageously, the clock recovery of this invention is performed by extracting timing information from a single threshold crossing, irrespective of the number of levels (M) of the signal. This was verified to provide sufficient spectral information for the proper operation of a clock recovery PLL.

Another advantage of the invention is that it provides a technology-independent, simple and flexible method of recovering a clock from a multi-level signal. The clock recovery circuit of this invention may be programmed for multiple line codes.

BRIEF DESCRIPTION OF THE DRAWINGS

The foregoing and other objects, features and advantages of the invention will be apparent from the following more particular description of the preferred embodiments, as illustrated in the appended drawings, where.

DESCRIPTION OF THE PREFERRED EMBODIMENT

As indicated above, the clock recovery is performed according to this invention by extracting timing information from a single threshold crossing.

Figure 1:
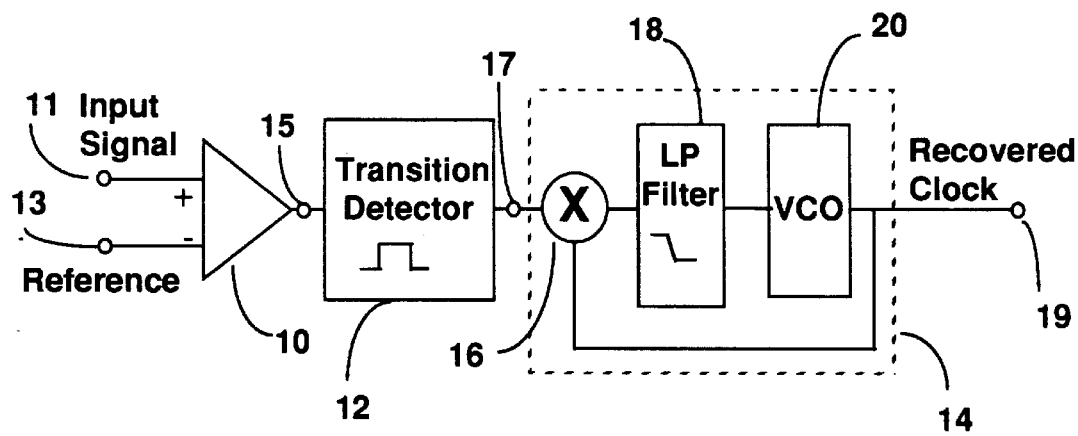
FIG. 1 is a block diagram of the clock recovery circuit of the invention.

FIG. 1 shows the block diagram of the clock recovery circuit according to this invention. The circuit comprises a high-speed differential comparator 10 with a programmable threshold, a transition detector block 12 and a phase looked loop (PLL) 14. A multi-level input signal is applied on the non-inverting input 11 of comparator 10, while a threshold or reference voltage is applied on the inverting input 13.

Figure 2:
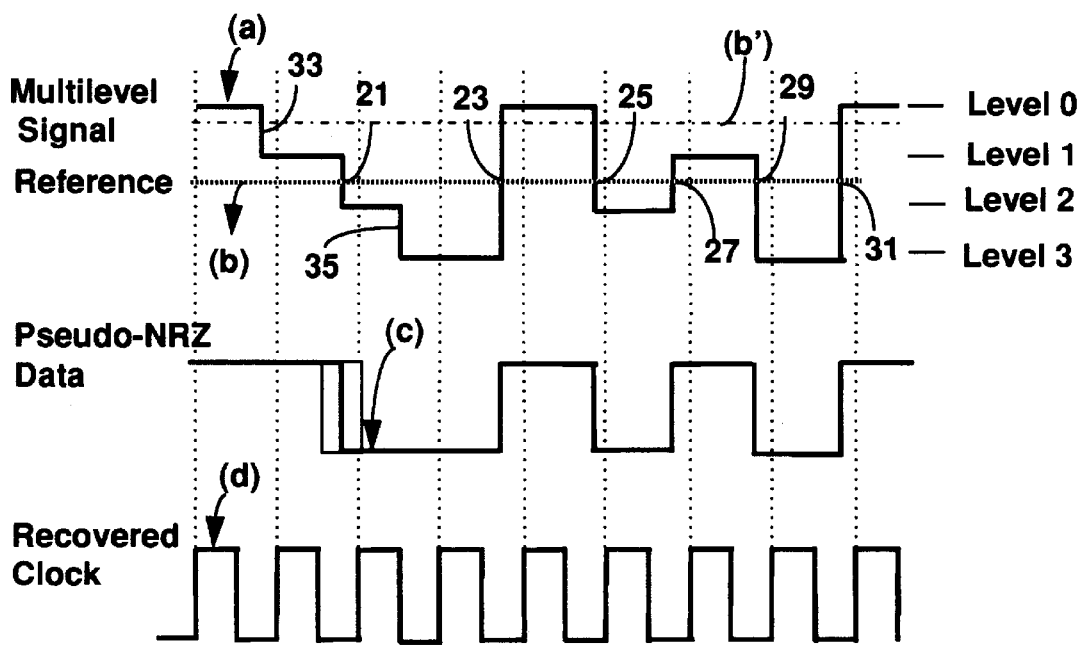
FIG. 2 illustrates the operation of the clock recovery method for a 4-level input signal.

FIG. 2 shows an example of a multi-level signal (a) and a reference signal (b), illustrating the crossing points noted 21, 23, 25, 27, 29, and 31. The crossing points give information regarding the time when the level of signal (a) becomes higher or lower than the reference (b). It is apparent from FIG. 2 that some transitions are not detected, as for example those noted with reference numerals 33 and 35. It can also be seen that a lower number of crossing points, and thus less timing information, is obtained if reference (b') is selected.

In the example shown in FIG. 2, signal (a) is a four-level signal, commonly called 2B1Q signalling. It is to be understood that other types of line codes may also be processed in accordance to the invention for recovering the clock.

The pseudo-NRZ signal provided at output 15 of comparator 10 is noted (c) on FIG. 2. The pseudo-NRZ signal has two levels, and contains timing information identifying crossing points noted 21, 23, 25, 27, 29, and 31. Thus, signal (c) changes from logic "1" to logic "0" at crossing points 21, 25 and 29, and from logic "0" to logic "1" at crossing points 23, 27, and 31. Comparator 10 could be a limiting amplifier with a programmable offset. It could also be described as an asynchronous comparator with programmable threshold.

Signal (c) with the timing information is applied to transition detector 12 at the input of PLL 14 for synchronizing the local clock, to obtain the recovered clock at output 19. PLL 14 is not described in further detail, as it is know type, namely it is of a charge-pump type with a phase detector 16, an external loop filter 18, and a voltage controlled oscillator (VCO) 20. The charge-pump PLL 14 generates the recovered clock signal (d).

As mentioned above, the quality of the resultant clock depends upon identification of a proper reference voltage (b). In general, some timing information is lost, such as the transitions 33 and 35, which are not detected when reference (b) is used. Therefore, the synchronization of the local clock generator 20 is not effected for each period. Further, the spectrum and the short and long term statistics of the recovered signal will not necessarily be the same as a random NRZ bit stream. The key criteria is, as in the case of using a transition-detection clock recovery PLL, that significant spectral content at the data frequency can be found from the pseudo-NRZ signal.

The best reference voltage (b) has been determined for some line codes, by using a fraction of the equalized received signal. The fraction is preferably different for each line code, as indicated in the examples below:

TABLE 1

The reference level for various line codes.

| | CODE | CODE LEVELS | REFERENCE LEVEL |
|---|---|---|---|
| 1 | NRZ | +1/−1 | 0.0 |
| 2 | PR4 | +1/0/−1 | 0.5 |
| 3 | MLT3 | +1/0/−1 | 0.5 |
| 4 | 2B1Q | +1/+0.33/−0.33/−1 | 0.0 |
| 5 | QPR4 | +1/+0.67/+0.33/−0.33/−0.67/−1 | 0.167 |
| 6 | 3B1Q | +1/+0.71/+0.43/0.14/−0.14/−0.43/−0.77/−1 | 0.0 |

Figure 3:
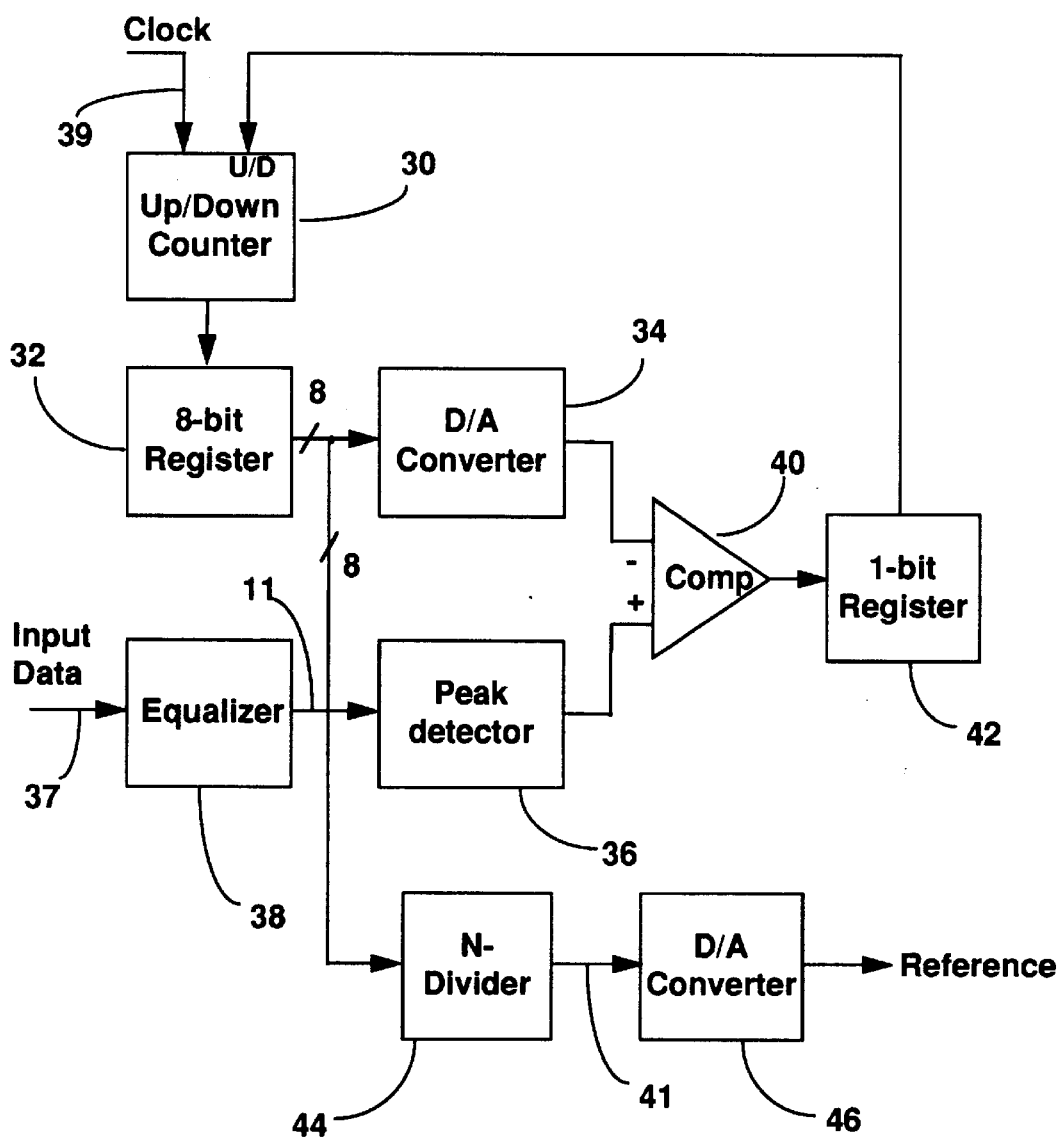
FIG. 3 shows the block diagram of a digital circuit for generating the reference voltage.
Figure 4:
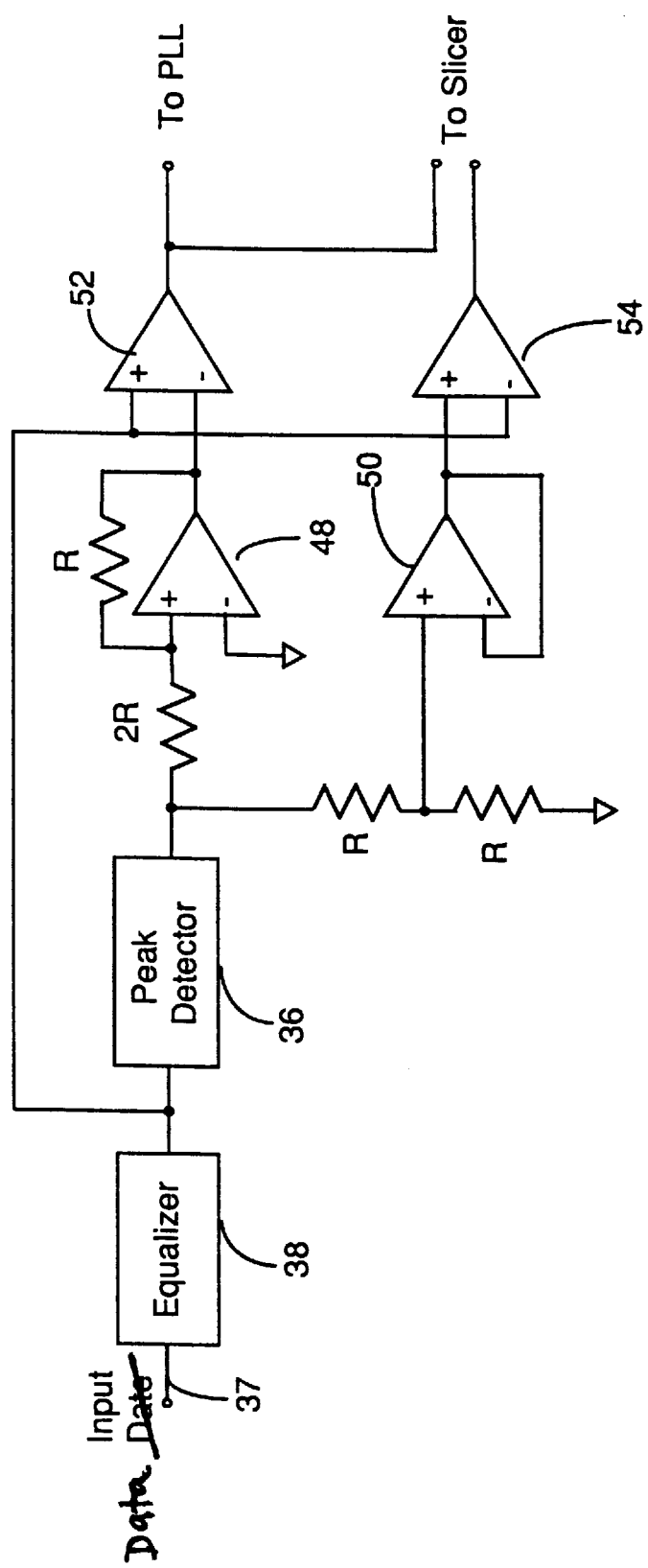
FIG. 4 shows the block diagram of an analog circuit for clock recovery from a three level signal.

These levels are relative to the peak of the equalized received signal, which is established with an analog peak detector and sealing amplifiers, as shown in FIG. 4, or peak detectors, comparators and digital-to-analog (D/A) converters shown in FIG. 3. When supplied with a continuous clock, this performs a recursive estimation of the peak of the equalized signal.

For the general class of signals known as M-ary pulse amplitude modulation (M-PAM), a threshold of zero is best, and will provide proper clock extraction, since this reference is most likely to be crossed by any given transition from one symbol to the next. If m is the number of the symbol levels, $m^2$ is the number of possible symbols that can be generated with m levels. For example, if m=4, the possible symbol pairs are 00; 01; 02; 03; 10; 11; 12; 13; 20; 21; 22; 23; 30; 31; 32; and 33, of which pairs 00; 11; 22; and 33 contain no transitions. For the general case, the number of the symbol pairs that contain transitions is:

$$T = m^2 - m$$

Of these T transitions, $T_0$ symbol pairs do not cross zero. In the example above for m=4, 8 symbol pairs do not cross zero, namely, 00; 01; 10; 11; 22; 23; 32; and 33. In the general case, $$T_0 = \left(\frac{m}{2}\right)^2 \cdot 2$$

The efficiency η of the zero cross detection scheme is given by the ratio between the number of zero cross transitions ($T_0$) over the total number of transitions (T), which is given by the formula:

$$\eta = \frac{T}{T_0} = \frac{m^2 - \frac{m}{2} \cdot 2}{m^2 - m} = \frac{m}{2(m-1)}$$

The following Table 2 shows the value of the efficiency of the scheme for various M-ary systems.

TABLE 2

Efficiency factor for various values of m

| m | 2 | 4 | 8 | 16 | 32 | 64 |
|---|---|---|---|---|---|---|
| η | 1 | 0.67 | 0.575 | 0.535 | 0.515 | 0.507 |

It is to be noted that as m increases, η tends toward 0.5, or approximately half of the transitions are not used for clock recovery.

FIG. 3 shows the block diagram of a circuit for generating the reference signal. The block diagram shown is a successive approximation type of peak detecting A/D. The reference signal is determined from the line code 37 after equalization in block 38 and the peak estimation value. A clock signal 39 is applied to an up/down counter 30, controlled with the output of a 1-bit register 42. The output of counter 30 is provided to a 8-bit register 32, and thereafter converted into an analog signal using D/A converter 34. Output of D/A converter 34 is compared to the output of a peak detector 36 in comparator 40, so that each time when the peak level of the input signal is greater than the output of D/A converter 34, counter 30 is advanced. Similarly, each time when the peak level of the input signal is less than the output of D/A converter 34, counter 30 is decreased.

The reference value is generated by a similar D/A converter 46 driven by an appropriately scaled control. The scaling is performed with an N-divider circuit 44 which receives the output of register 32 and the appropriate value is used to control the reference-generation D/A converter 46.

In this way, the peak value is obtained and can be scaled appropriately for the line code. In the digital embodiment, the scaling factor (N) can be easily changed to suit different line codes that may be implemented. The value of N is different for different line codes, and examples for each line code are found in Table 1. (N=2 for line code 1, N=3 for line codes 2 and 3, N=4 for line code 4, N=6 for line code 5, and N=8 for line code 6).

FIG. 4 illustrates a block diagram of an analog circuit for generating the reference voltage for a three level line code. The peak voltage is detected with peak detector 36 and then used to generate two thresholds at ±0.5 relative to the peak with amplifiers 48 and 50. The PLL is then synchronized with the transitions of the signal over the +0.5 threshold obtained with comparator 52.

Figure 5A:
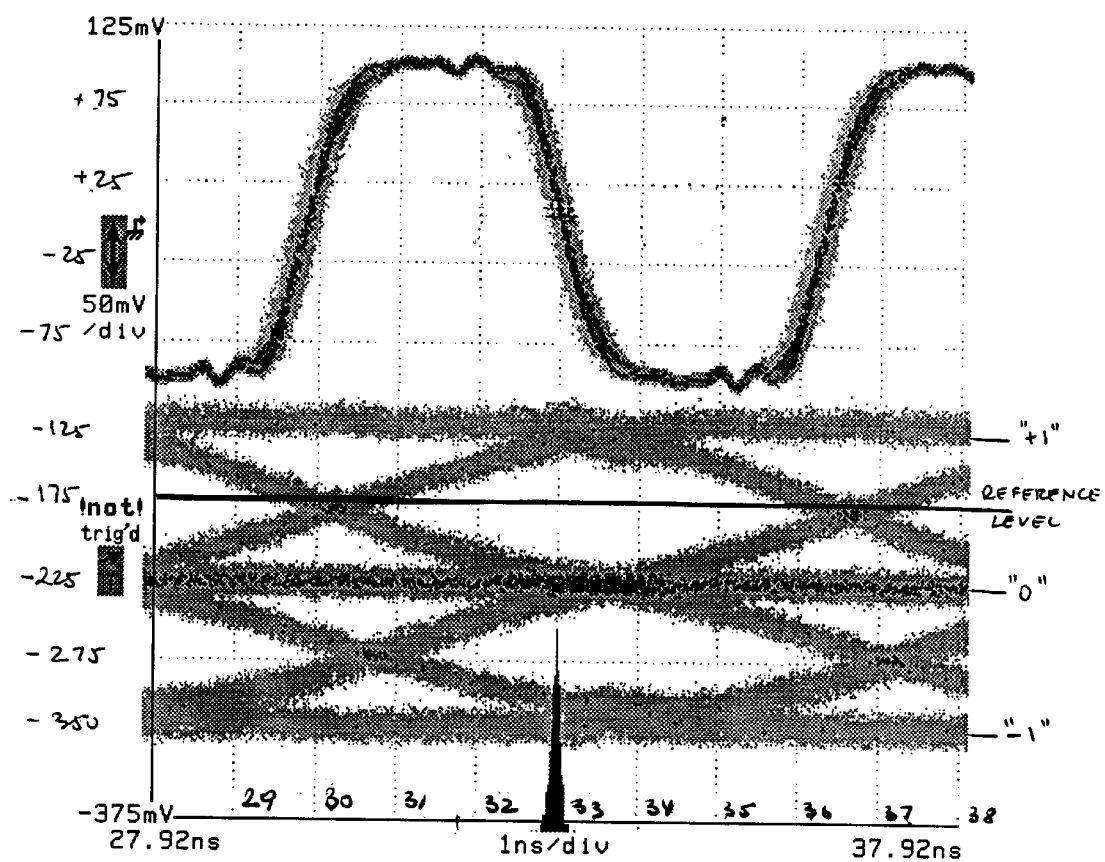
FIG. 5A is an oscilloscope trace showing the operation of the clock recovery circuit for a MLT3 coded signal.

FIG. 5A is an oscilloscope trace showing the successful generation of a clock from an MLT3 coded input signal. The bottom part of the graph illustrates the eye diagram of the recovered signal after equalization having three levels at approximately −325 mV, −225 mV and −125 mV. This signal is half of a differential signal, so the effective levels are −200, 0, +200, corresponding to logic "−1", "0" and "+1", respectively. The signal at the top of the graph is the recovered clock.

Figure 5B:
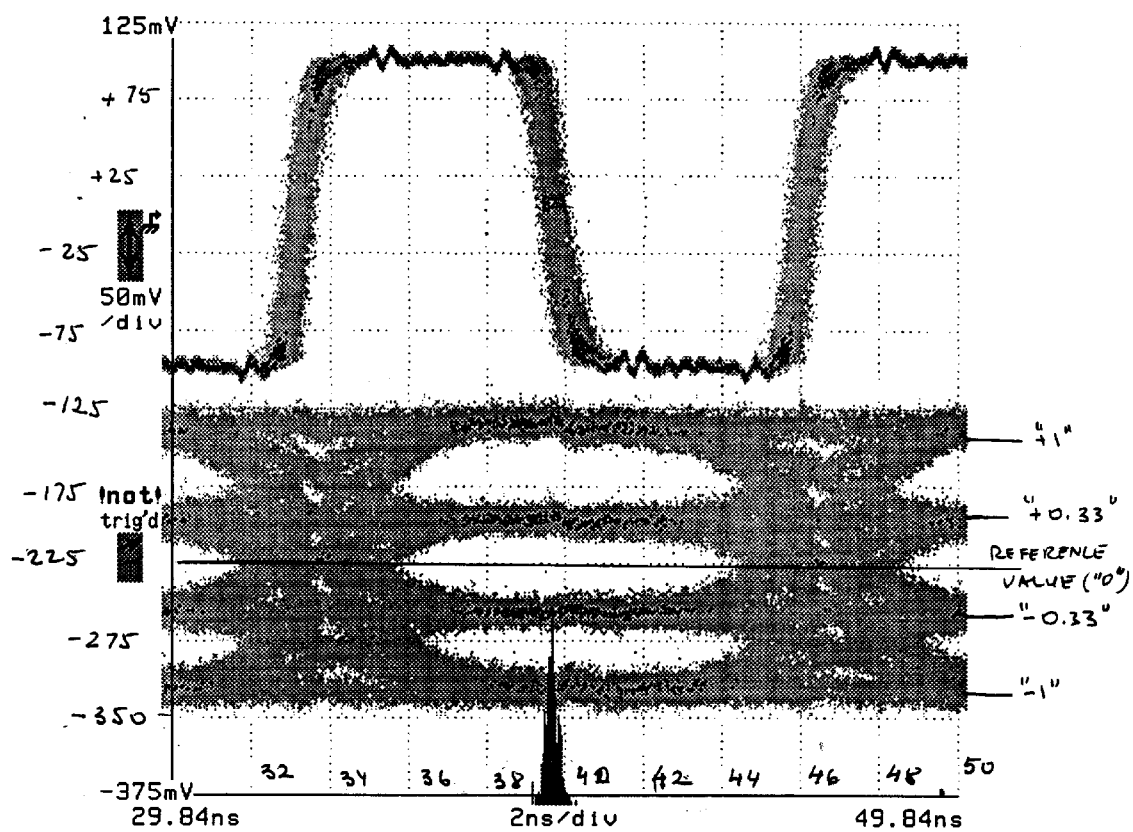
FIG. 5B is an oscilloscope trace showing the operation of the clock recovery circuit for a 2B1Q coded signal.

FIG. 5B is a similar oscilloscope trace showing the successful generation of a clock from a 2B1Q coded input signal.

While the invention has been described with reference to particular example embodiments, further modifications and improvements which will occur to those skilled in the art, may be made within the purview of the appended claims, without departing from the scope of the invention in its broader aspect.

What is claimed is:

1. A circuit for clock recovery from an M-ary signal, where M is the number of levels taken by said M-ary signal, comprising:

a comparator for receiving said M-ary signal and one predetermined reference level and providing a two-level signal, said two-level signal assuming a first level whenever an amplitude of said M-ary signal is higher than said reference level and assuming a second level whenever the amplitude of said M-ary signal is lower than said reference level, such that said two-level signal comprises information on less than all transitions in said M-ary signal;

a transition detector for receiving said two-level signal and providing a pseudo-clock signal; and a phase locked loop circuit for generating a recovered clock signal synchronized with said pseudo-clock signal.

2. A circuit as claimed in claim 1, wherein said comparator is a limiting amplifier with a programmable offset for adjusting said reference level according to M and to the technique used for encoding said M-ary signal.

3. A circuit as claimed in claim 1, further comprising a reference level generating circuit for determining a peak value of said M-ary signal and for generating said reference level as a fraction of said determined peak value, according to M and to the technique used for encoding said M-ary signal.

4. A circuit as claimed in claim 1, wherein M is an even number greater than 2 and said transition detector is a zero-crossing detector.

5. A method for clock recovery from an M-ary signal, where M is the number of levels taken by said M-ary signal, comprising the steps:

comparing said M-ary signal with one predetermined reference level to provide a two-level signal, said two-level signal assuming a first level whenever an amplitude of said M-ary signal is higher than said reference level and assuming a second level whenever the amplitude of said M-ary signal is lower than said reference level, such that said two-level signal comprises information on less than all transitions in said M-ary signal;

generating a pseudo-clock signal comprising the transitions between said two levels in said two-level signal; and synchronizing a phase locked loop circuit with said pseudo-clock signal for generating a recovered clock signal.

6. A method as claimed in claim 5, further comprising determining a peak value of said M-ary signal, and generating said reference level as a fraction of said determined peak value in accordance with the number M of levels in said M-ary signal and with the technique used for encoding said M-ary signal.

7. A method as claimed in claim 5, wherein M is an even umber greater than 2, and said reference level is 0V.

8. A method as claimed in claim 5, wherein M is an odd number and said reference level is greater than 0V and less than the smallest positive level of said M-ary signal.

* * * * *